(12) United States Patent
Mori

(10) Patent No.: US 7,554,621 B2
(45) Date of Patent: Jun. 30, 2009

(54) NANOSTRUCTURED INTEGRATED CIRCUITS WITH CAPACITORS

(75) Inventor: Kiyotaka Mori, Cambridge, MA (US)

(73) Assignee: Panasonic Corporation, Osaka (JP)

( * ) Notice: Subject to any disclaimer, the term of this patent is extended or adjusted under 35 U.S.C. 154(b) by 589 days.

(21) Appl. No.: 11/474,645

(22) Filed: Jun. 26, 2006

(65) Prior Publication Data

US 2008/0006883 A1 Jan. 10, 2008

(51) Int. Cl.
*G02F 1/136* (2006.01)
*G02F 1/1343* (2006.01)
*H01L 27/108* (2006.01)

(52) U.S. Cl. .................. 349/43; 349/38; 257/296

(58) Field of Classification Search ........... 349/43, 349/38; 257/296, 501, 379, 72
See application file for complete search history.

(56) References Cited

U.S. PATENT DOCUMENTS 6,919,119 B2 * 7/2005 Kalkan et al. ............ 428/119
2004/0135951 A1 * 7/2004 Stumbo et al. ........... 349/139
2005/0181587 A1 * 8/2005 Duan et al. .............. 438/551

* cited by examiner

*Primary Examiner*—Mike Qi
(74) *Attorney, Agent, or Firm*—RatnerPrestia

(57) ABSTRACT

A nanostructured integrated circuit including a nanostructured element and a thin film transistor (TFT) and capacitor formed along the nanostructured element. The nanostructured element includes: an inner semiconductor material; and an outer insulating layer. The TFT includes: the inner semiconductor material of the nanostructured element; a source electrode electrically coupled to a source portion of the inner semiconductor material; a drain electrode electrically coupled to a drain portion of the inner semiconductor material; a gate portion of the outer insulating layer located between the source electrode and the drain electrode; and a gate electrode formed on the gate portion. The capacitor includes: a capacitor portion of the outer insulating layer of the nanostructured element; and a capacitor electrode formed on the capacitor portion. The capacitor portion of the outer insulating layer is located between the gate portion of the outer insulating layer and either the drain or source electrode.

36 Claims, 9 Drawing Sheets

NANOSTRUCTURED INTEGRATED CIRCUITS WITH CAPACITORS

FIELD OF THE INVENTION

The present invention concerns integrated circuitry that includes capacitors formed using nanostructured materials. In particular, the integrated circuitry may be an active matrix pixel driving circuit.

BACKGROUND OF THE INVENTION

Nanostructured material may allow for the creation of novel integrated circuit designs. For example, US Patent Publication 2005/0181587 to Duan et al. discloses the use of nanowires as channel materials in thin film transistors (TFT's).

FIG. 2 shows a prior art TFT 200 from this application that includes thin film of nanowires 100. TFT 200 has a source electrode 202, a gate electrode 204, a drain electrode 206, formed on a substrate 208. Thin film of nanowires 100 is coupled between source electrode 202 and drain electrode 206 over a portion of gate electrode 204. Thin film of nanowires 100 substantially operates as a channel region for the transistor of semiconductor device 200.

In this prior art reference, the nanowires of thin film of nanowires 100 are disclosed to be single crystal semiconductor nanowires that span all the way between source electrode 202 and drain electrode 206 so that electric carriers can transport through the single crystals nanowires, resulting in high mobility which is virtually impossible to obtain with current amorphous and polysilicon technologies.

Duan et al. disclose that the nanowires of thin film of nanowires 100 can be aligned or oriented. For example, the nanowires of thin film of nanowires 100 shown in FIG. 2 can be aligned parallel to the length of the channel between source electrode 202 and drain electrode 206, or can be aligned in alternative ways.

Duan et al. also disclose that thin film of nanowires 100 can be formed with a sufficient number of nanowires to provide desired characteristics for semiconductor device 200. For example, thin film of nanowires 100 can be formed of a sufficient number of nanowires to achieve a desired current density or current level desired for the particular semiconductor device. For instance, in the TFT example of FIG. 2, thin film of nanowires 100 can be formed to have a current level in the channel of greater than about 10 nanoamps.

Additionally, Duan et al. disclose that thin film of nanowires 100 can be formed to have asymmetric mobility. For example, this can be accomplished by asymmetrically aligning the nanowires of thin film of nanowires 100, and/or by doping the nanowires in a particular manner. Such asymmetric mobility can be caused to be much greater in a first direction than in a second direction. For example, asymmetric mobilities can be created in the order of 10, 100, 1000, and 10000 times greater in the first direction than in the second direction, or to have any other asymmetric mobility ratio between, greater, or less than these values.

Thus, TFT's as disclosed by Duan et al. may provide many advantages over traditional semiconductor transistors.

As another example, US Patent Publication 2004/0135951 to Stumbo et al. discloses the use of nanowire enabled transistors for a display driving application.

FIG. 5 is a diagram of a pair of nanowire row transistors within a prior art liquid crystal display (LCD) disclosed by Stumbo et al. This diagram includes nanowire row transistor 510, nanowire row transistor 520, pixel 530, nanowire pixel transistor 540, column trace 550, row trace 560, high trace 570, gate trace 572, low trace 574, and gate trace 576. Nanowire row transistor 510 includes set of nanowires 515. Likewise nanowire row transistor 520 includes set of nanowires 525. Nanowire row transistors 510 and 520 are used to turn nanowire pixel transistor 540 on and off.

Nanowire row transistor 510 has one side of the set of nanowires 515 coupled to row trace 560 and the other side coupled to high trace 570. High trace 570 is connected to a source of operating voltage (e.g. an on voltage). A point on each nanowire between these connections on the set of nanowires 515 that collectively serve as the transistor gate is connected to gate trace 572.

Nanowire row transistor 520 has one side of the set of nanowires 525 coupled to row trace 560 and the other side coupled to low trace 574. Low trace 574 is connected to a source of reference voltage (e.g. ground). A point on each nanowire between these connections on the set of nanowires 525 that collectively serve as the transistor gate is connected to gate trace 576.

When nanowire pixel transistor 560 is to be turned on, a gate voltage is applied over gate trace 572 to turn nanowire row transistor 510 on. At the same time a ground potential is applied over gate trace 576 to turn nanowire row transistor 520 off. As a result, a gate voltage is connected to nanowire pixel transistor gate 545 to turn nanowire pixel transistor 540 on. When nanowire pixel transistor 510 is to be turned off, the opposite occurs. The gate voltage is removed from gate trace 572 to turn nanowire row transistor 510 off. And, at the same time a gate voltage is applied to gate trace 576 to turn nanowire row transistor 520 on. As a result, the gate voltage of nanowire pixel transistor gate 545 is driven to ground potential to turn nanowire pixel transistor 540 off.

SUMMARY OF THE INVENTION

An exemplary embodiment of the present invention is a nanostructured integrated circuit including: a substrate having a surface; nanostructured elements coupled to the surface of the substrate; a thin film transistor (TFT) formed on the surface of the substrate; and a capacitor formed on the surface of the substrate. Each nanostructured element includes: an inner semiconductor material that has a source portion and a drain portion; and an outer insulating layer that is formed on the inner semiconductor material. The TFT includes a first subset of the nanostructured elements which are arrayed together on the surface of the substrate and the capacitor includes a second subset of nanostructured elements arrayed together on the surface of the substrate. The TFT also includes: a source electrode electrically coupled to the source portion of the inner semiconductor material of each nanostructured element in the first subset of nanostructured elements; a drain electrode electrically coupled to the drain portion of the inner semiconductor material of each nanostructured element of the first subset; and a gate electrode formed on a gate portion of the outer insulating layer of each nanostructured element of the first subset. The capacitor also includes: a first capacitor electrode electrically coupled to the source electrode, the gate electrode, or the drain electrode; and a second capacitor electrode formed on a capacitor portion of the outer insulating layer of each nanostructured element of the second subset of nanostructured elements.

Another exemplary embodiment of the present invention is a nanostructured capacitor including: a substrate having a surface; nanostructured elements coupled to the surface of the substrate; a first capacitor electrode; and a second capacitor electrode. Each nanostructured element includes a core material having a contact portion and an outer insulating layer formed on the core material. The first capacitor electrode is electrically coupled to the contact portion of the core material of each nanostructured element and the second capacitor electrode is formed on a capacitor portion of the outer insulating layer of each nanostructured element.

An additional exemplary embodiment of the present invention is a nanostructured integrated circuit including: a nanostructured element; a TFT formed along the nanostructured element; and a capacitor formed along the nanostructured element. The nanostructured element includes: an inner semiconductor material that has a source portion and a drain portion; and an outer insulating layer that is formed on the inner semiconductor material. The TFT includes: the inner semiconductor material of the nanostructured element; a source electrode electrically coupled to the source portion of the inner semiconductor material of the nanostructured element; a drain electrode electrically coupled to the drain portion of the inner semiconductor material; a gate portion of the outer insulating layer located between the source electrode and the drain electrode; and a gate electrode formed on the gate portion of the outer insulating layer of the nanostructured element. The capacitor includes: a capacitor portion of the outer insulating layer of the nanostructured element; and a capacitor electrode formed on the capacitor portion of the outer insulating layer. The capacitor portion of the outer insulating layer is located between the gate portion of the outer insulating layer and either the drain electrode or the source electrode.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawing are the following figures.

DETAILED DESCRIPTION OF THE INVENTION

Exemplary embodiments of the present invention involve exemplary integrated circuitry including nanostructured elements. These exemplary integrated circuits include capacitors processed using the same processes used to form nanostructured thin film transistors (TFT's). Exemplary embodiments of the present invention may include capacitors made from the same type of nanostructured materials as the TFT's in the circuit, for example nanowire, nanoribbon, nanorod, other nanoparticles, or mixtures thereof. These exemplary circuits may be used in numerous applications such as display applications, which often require capacitors for functions in pixel or driver circuits, such as storage and threshold voltage ($V_{th}$) adjustment. In memory applications, storage capacitors may be used to store data.

Figures 1A, 1B:
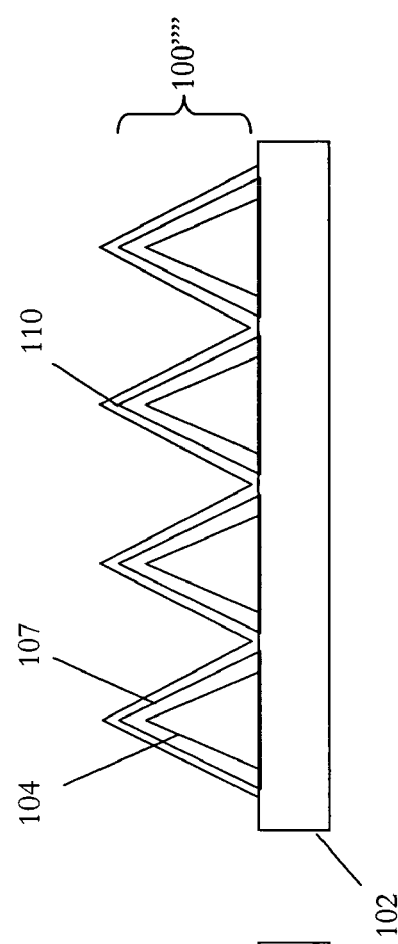
FIGS. 1A, 1B, 1C, 1D, 1E, 1F, and 1H are cross-sectional end plan drawings illustrating exemplary arrays of nanowire or nanorods that may be used in integrated circuitry according to the present invention.
Figures 1C, 1D:
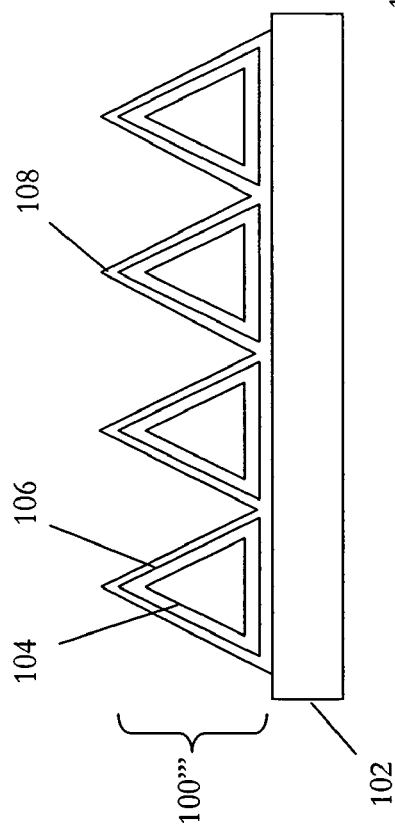
Figure 1E:
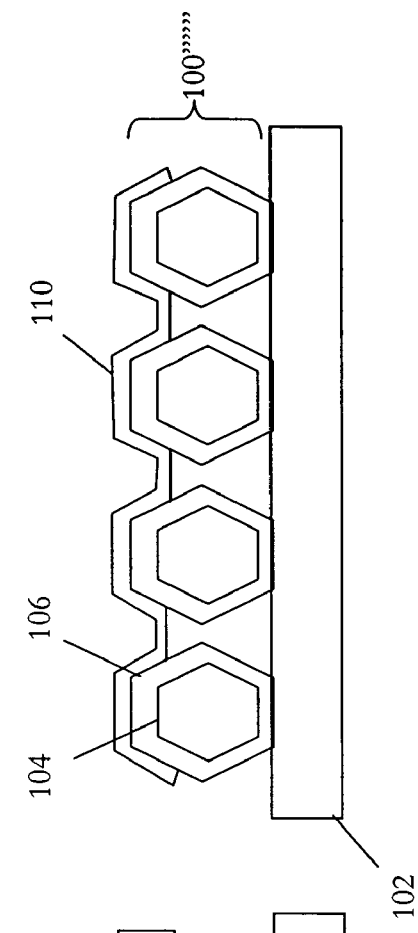
Figure 1F:
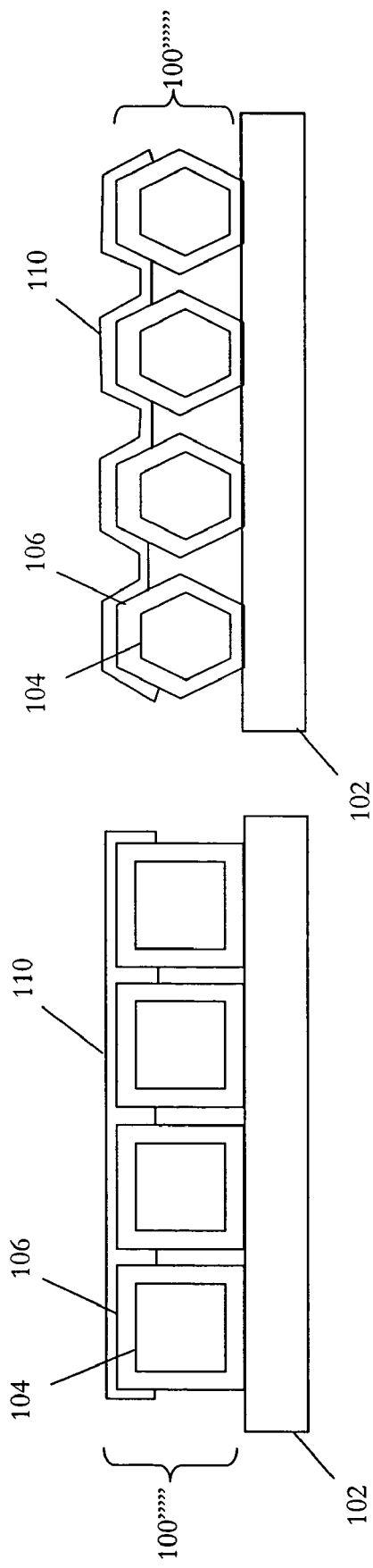
Figure 1H:
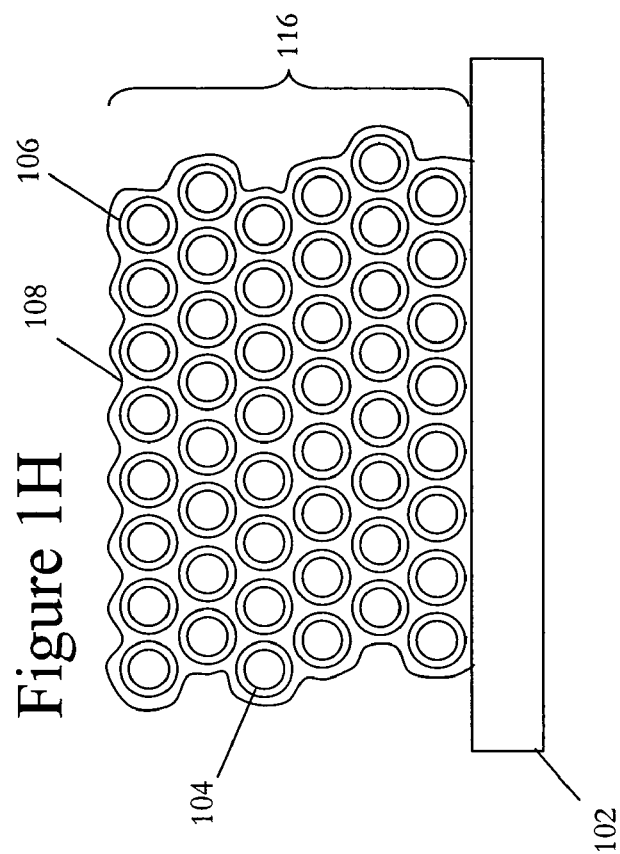
Figure 1G:
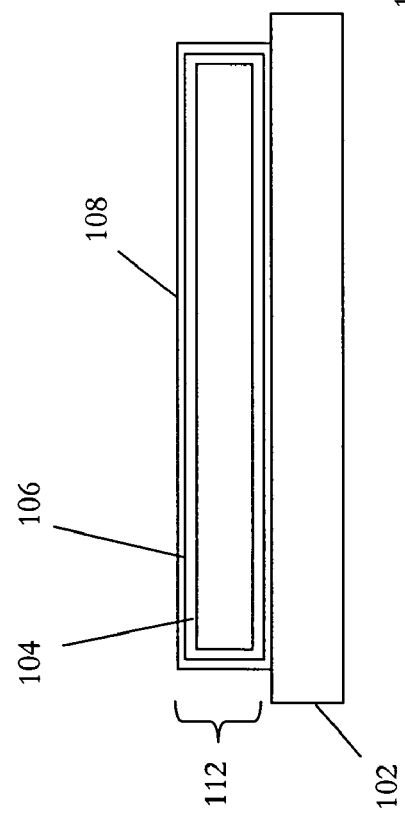
FIG. 1G is a cross-sectional end plan drawing illustrating an exemplary nanoribbon that may be used in integrated circuitry according to the present invention.

FIGS. 1A-1I illustrate a number of exemplary arrays of nanostructured elements that may be used in the exemplary embodiment of the present invention. These exemplary arrays are merely illustrative and not intended to be limiting. The individual nanostructured elements of these arrays may have a number of different shapes. The various shapes may be selected to increase performance or ease production. Examples of nanostructured elements that may be used in exemplary embodiments of the present invention include: nanowires and nanorods (as shown in FIGS. 1A-1F, 1H and 1I), and nanoribbons (as shown in FIG. 1G). Each nanostructured element may desirably be substantially straight. Alternatively, the nanostructured elements may by curved or may having one or more sharp bends, for example a zigzag shape, depending on the space in which the nanostructured array is to be formed.

Each nanostructured element includes core material 104 and outer insulating layer 106 formed on core material 104. Although it typically surrounds core material 104, the outer insulating layer 106 may also, as illustrated by outer conducting layer 107 in FIG. 1D, only partially surround the core semiconductor.

Nanostructured material may include metals, semiconductors, ceramics, organic materials, or glass.

The core material may be formed of a single crystalline, polycrystalline, or amorphous material and may be conductive or semiconductive, depending on the application. Desirably, the core of the nanostuctured elements may have cross-sectional dimensions on the order of 1 nm to 100 nm, although some nanostructured elements may have cross-sectional dimensions outside of this range. In particular, nanoribbons may be formed that are thinner and/or wider than this exemplary range.

In case of nanostructured elements that are to be used in transistors, core material 104 is desirably formed of a semiconductive material. This semiconductive material may be: an elemental semiconductor, such as carbon, silicon, germanium, or grey tin; a IV-IV semiconductor, such as SiGe, SiC, III-V semiconductor such as AlAs, AlP, AlSb, BN, BP, GaAs, GaN, GaP, GaSb, InAs, InP, InSb, or their derivatives; a II-VI semiconductor, such as CdS, CdSe, CdTe, ZnO, ZnS or their derivatives; a IV-VI semiconductor, such as PbS, PbTe or their derivatives; an organic semiconductor, including polymeric, oligomeric and/or small molecule organic semiconductors; a liquid semiconductor; an ionic liquid semiconductor; a solid state ionic liquid semiconductor; or a combination thereof. These semiconductor materials may be intrinsic, p-type or n-type. Portions of this inner semiconductor layer may be highly doped in (p-type or n-type) adjacent to the source and drain electrodes. Also, the portion to be used as a semiconductor channel region may be doped to adjust its threshold voltage and/or its mechanical, optical and other electrical properties. In addition, one or more sections of the semiconductor material may be doped to form a longitudinal doping profile in core material 104. This doping profile may be NPN, PNP, PIP, NIN, PIN, or another profile depending on the desired effects. Additionally, the semiconductor material may be fully doped or may be shallow doped across a cross section of the nanostructured element.

In case of nanostructured elements that are to be used in capacitors, core material 104 may be formed of a conductive material or a semiconductive material. If a semiconductive material is used for the core material of a nanostructured capacitor the portion acting as the inner electrode of the capacitor may be doped to improve the conductivity of this section.

Outer insulating layer 106 may be formed from amorphous, crystalline, polycrystalline, or organic compound materials. Alternatively, outer insulating layer 106 may include a liquid, an ionic liquid layer, a gas, or even vacuum surrounded by an encapsulation layer. This encapsulation layer may be insulating. Alternatively, outer surrounding electrode 108 (shown FIGS. 1A, 1C, 1G and 1H) may be used as the encapsulation layer. Typically, outer insulating layer 106 may have a thickness in the range of 1 nm to 3 nm. However, this range is not intended to be limiting.

One exemplary embodiment of a nanostructured material that may be used in embodiments of the present invention is a silicon core 104 surrounded by a silicon dioxide insulating layer 106.

Figure 1I:
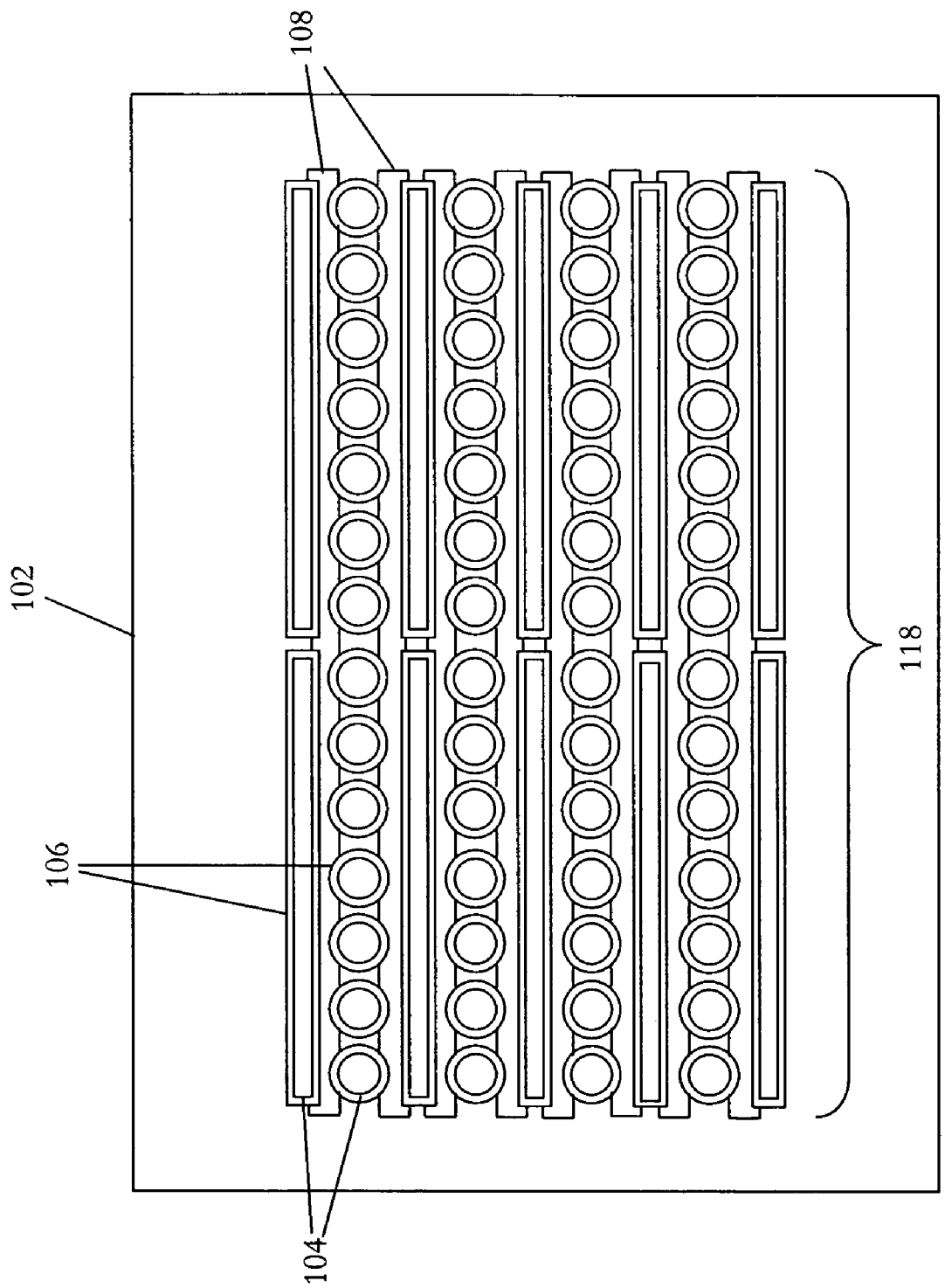
FIG. 1I is a cross-sectional top plan drawing illustrating an exemplary array of nanostructured elements aligned substantially normal to the substrate surface that may be used in integrated circuitry according to the present invention.
Figure 2:
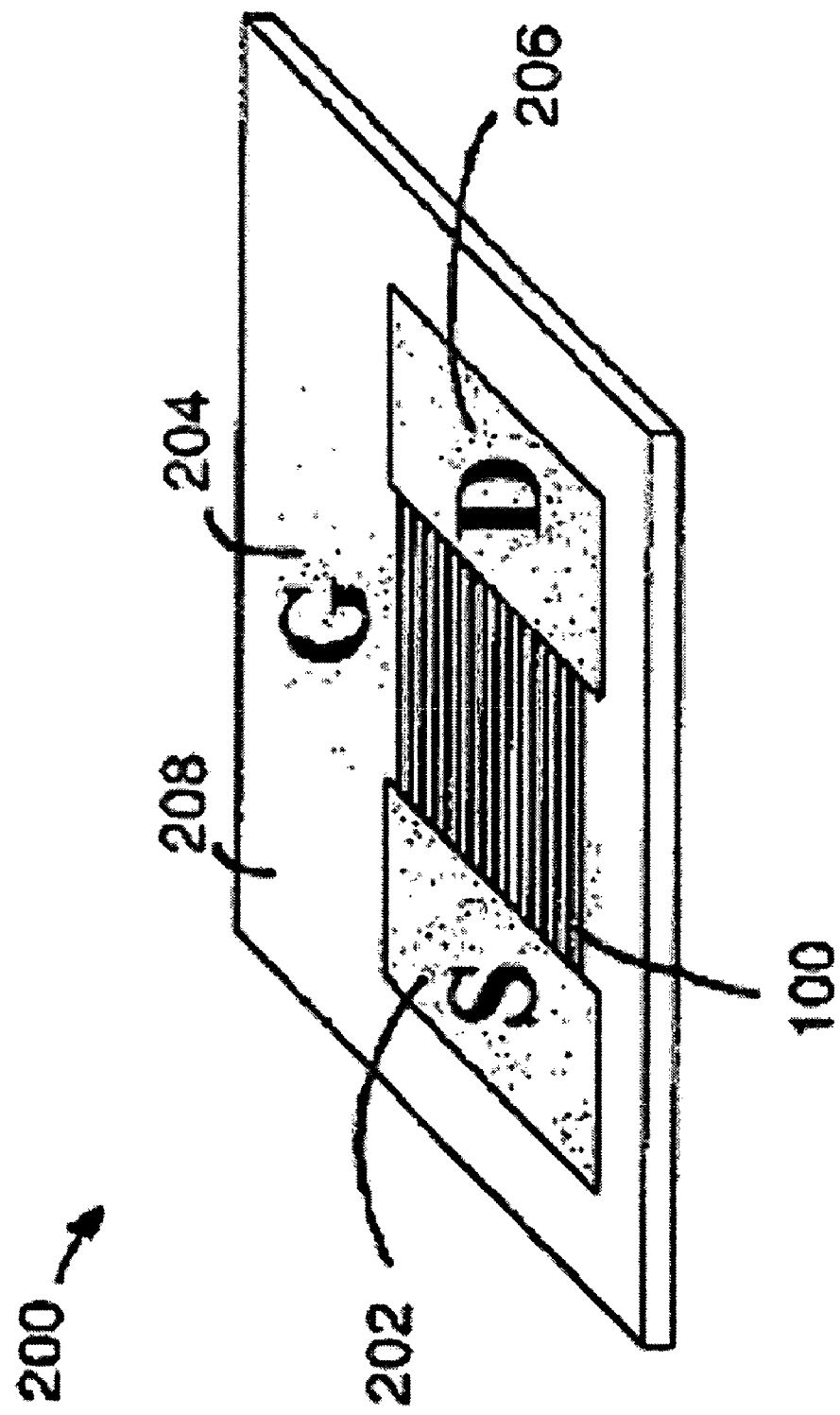
FIG. 2 (Prior art) is a perspective drawing of a prior art thin film transistor (TFT) that includes nanowire channel material.
Figure 3:
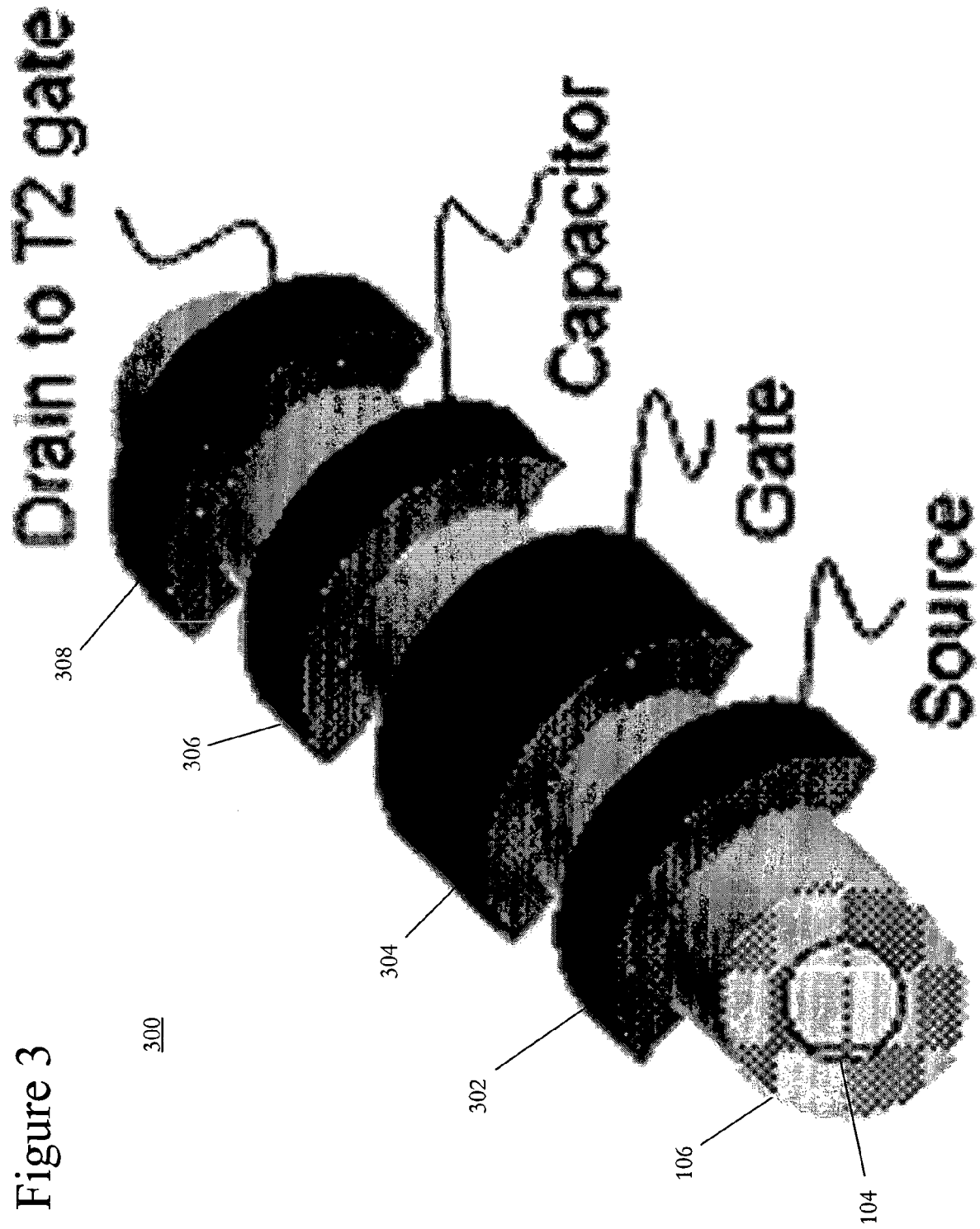
FIG. 3 is a perspective drawing of a circuit element including a TFT and a capacitor integrated on a single nanowire according to the present invention.

One or more electronic components may be integrated on a single nanostructured element, as shown in FIG. 3. Alternatively an array of nanostructured elements, such as the exemplary arrays shown in FIGS. 1A-1F, and 1H, may be used to form electronic components. In case of nanostructured materials having shapes with a longitudinal axis, such as nanowires, nanorods, or nanoribbons, the individual nanostructured elements may form an array of substantially parallel elements or may be randomly distributed. The nanostructured elements may be aligned not only with their longitudinal axes in plane of the surface of substrate 102 (as shown in FIGS. 1A-1H), but may alternatively be aligned substantially normal to the surface of substrate 102 (i.e. vertically, as shown in FIG. 1I) to form an integrated circuit structure that minimizes the surface area used for the circuit. As shown in FIG. 1G, the nanostructured elements may be stacked on top of each other to form exemplary stacked array 116.

FIGS. 1A-1I illustrate cross-sections of exemplary nanostructured materials formed on substrate 102 that may be used in embodiments of the present invention. These cross-sections illustrate exemplary outer electrodes formed on the outer insulating layers of the nanostructured elements. A conductive layer may be formed over the entire outer insulating layer 106 of the nanostructured elements and the patterned to form the desired outer electrodes, or the outer electrodes may be formed on selected portions of outer insulating layer 106, using standard semiconductor fabrication techniques, such as photolithographic techniques.

FIG. 1A illustrates exemplary nanostructured material array 100' of circular nanowires (or nanorods) formed in a single layer. In this exemplary array of nanostructured elements, outer surrounding electrode 108 is shown completely surrounding each nanowire or nanorod of array 100' and merging into a single electrode structure. It is noted that outer surrounding electrode 108 may include separate portions surround each nanostructured element individually and electrically coupled together by, for example, solder, when exemplary array 100' is formed. Alternatively, the nanostructured elements may be formed into the array structure and then sintered to merge the individual outer surrounding electrodes as shown in exemplary array 100'.

FIG. 1B illustrates exemplary nanostructured material array 100" of circular nanowires (or nanorods) formed in a single layer. In this exemplary array of nanostructured elements, outer electrode 110 only partially surrounds each nanowire (or nanorod) of array 100".

FIG. 1C illustrates exemplary nanostructured material array 100'''. This exemplary array is similar to exemplary array 100' of FIG. 1A, except that it includes nanowires (or nanorods) that have a triangular cross-section.

FIG. 1D illustrates exemplary nanostructured material array 100'''' of triangular nanowires (or nanorods) formed in a single layer. As in the exemplary embodiment of FIG. 1B, exemplary array 100'''' of nanostructured elements includes outer electrode 110 that only partially surrounds each nanowire (or nanorod). FIG. 1D also illustrates triangular nanowires (or nanorods) in which outer insulating layer 107 only covers two sides of core material 104.

FIGS. 1E and 1F illustrate exemplary nanostructured material arrays 100''''' and 100'''''', respectively. These exemplary arrays are similar to exemplary array 100" of FIG. 1B, except that exemplary array 100''''' of FIG. 1E includes nanowires (or nanorods) that have a square cross-section and exemplary array 100'''''' of FIG. 1F includes nanowires (or nanorods) that have a hexagonal cross-section.

FIG. 1G illustrates exemplary nanostructured material 112 formed of a single nanoribbon. In this exemplary nanostructured material, outer surrounding electrode 108 is shown completely surrounding outer insulator layer 106 the nanoribbon. It is noted that a nanostructured material that includes an array of nanoribbons may be formed. Additionally, nanoribbons may be formed arranged in an exemplary nanostructured material such that their longer cross-sectional dimension is substantially perpendicular to the surface of substrate 102, rather than substantially parallel to the surface as shown in FIG. 1G.

FIG. 1H illustrates exemplary stacked nanostructured material array 116 of circular nanowires (or nanorods) formed with multiple layers. In this exemplary array of nanostructured elements, outer surrounding electrode 108 is shown completely surrounding each nanowire or nanorod of array 116 and merging into a single electrode structure. As in the exemplary embodiment of FIG. 1A, it is noted that outer surrounding electrode 108 in exemplary stacked nanostructured material array 116 may include separate portions surrounding each nanostructured element individually and electrically coupled together by, for example, solder, when exemplary stacked array 116 is formed. Alternatively, the nanostructured elements may be formed into the stacked array structure and then sintered to merge the individual outer surrounding electrodes as shown in exemplary stacked array 116. Conformable deposition techniques may also be used to form surrounding electrode 108.

FIG. 1I illustrates a top cross-sectional view of exemplary mixed nanostructured material array 118 which includes both circular nanowires (or nanorods) and nanoribbons formed in multiple layers. This exemplary array is arranged to be substantially perpendicular to the surface of substrate 102. In this exemplary array of nanostructured elements, outer electrode 110 is shown separating rows of nanowires (or nanorods) from rows of nanoribbons.

Although FIGS. 1A-1I illustrate a number of exemplary nanostructured materials that may be used in exemplary embodiments of the present invention, one skilled in the art will understand that many other exemplary nanostructured elements and array configurations may also be used in exemplary embodiments of the present invention.

The cross-sectional views of FIGS. 1A-1I illustrate the structure of exemplary nanostructured capacitors according to the present invention. These exemplary nanostructured capacitors may be formed using an array of nanostructured elements coupled to the surface of substrate 102. Core material 104 of each nanostructured element is used as one plate of the exemplary capacitor and outer surrounding electrode 108 (or outer electrode 110) is used as the other plate of the capacitor. A capacitor portion of outer insulating layer 106 (or 107) separates the plates and may desirably provide a dielectric layer depending on the composition of this layer.

One capacitor electrode is desirably electrically coupled to a contact portion of the core material of each nanostructured element in the nanostructured material. This contact portion may be at one end of the nanostructured element. Alternatively, a portion of outer insulating layer 106 (or 107) may be removed to expose the contact portion of core material 104 or doped to provide electrical conduction through the layer. In the case of nanostructured elements formed with an insulating layer that only partially surrounds core material 104, such as, for example insulating layer 107 illustrated in FIG. 1D, electrical contact may be made on a portion of the exposed surface of core material 104. The other capacitor electrode is outer surrounding electrode 108 (or outer electrode 110).

The capacitance of the nanostructured capacitor is determined by the geometry of the nanostructured elements, the number of nanostructures elements in the nanostructured material, the materials of the nanostructured elements and the outer electrode, and the thickness and surface area of the capacitor portion of the outer insulating layer. It is noted that the outer insulating layer may be of thinned or thickened in the capacitor portion to tune the capacitance. This thickening or thinning may be performed using standard semiconductor fabrication techniques.

FIG. 3 illustrates exemplary nanostructured integrated circuit 300 formed on a single nanostructured element. Exemplary nanostructured integrated circuit 300 includes: a TFT and a capacitor formed along the nanostructured element. The nanostructured element includes inner semiconductor material 104 and outer insulating layer 106. Although FIG. 3 illustrates the nanostructured element as a circular nanowire, it is contemplated that any of the other nanostructured elements discussed above with reference to FIGS. 1A-1I may be used instead, as long as the core material is chosen to be a semiconductive material. Additionally, it is noted that electrode 302, 304, 306, and 308 are shown as extending only part way around outer insulation layer 106 in the exemplary embodiment of FIG. 3. However, one skilled in the art will understand that one or more of these electrodes may completely surround outer insulation layer 106 in other exemplary nanostructured integrated circuit according to the present invention.

The TFT includes: source electrode 302 that is electrically coupled to a source portion of the inner semiconductor material of the nanostructured element; and drain electrode 308 that is electrically coupled to a drain portion of inner semiconductor material 104 of the nanostructured element. One skilled in the art will understand that the designation of one of these electrodes (302 and 308) as a source electrode and one as a drain electrode is based on the direction of current flow when the component is used in a circuit and is reversible.

These electrical connections may be accomplished as described above by etching or doping a portion of outer insulating layer 106 (as shown in FIG. 3) or by using an exposed portion of inner semiconductor material 104. The source portion and/or the drain portion of inner semiconductor material 104 may be doped to improve the electrical contact. The TFT also includes gate electrode 304 which is formed on a gate portion of outer insulating layer 106 of the nanostructured element. This gate portion of outer insulating layer 106 is located between the source electrode and the drain electrode. The portion of inner semiconductor material 104 corresponding to the gate portion of outer insulating layer 106 is used as a semiconductor channel region of the TFT. As described above, this channel region may be doped to adjust its threshold voltage and/or its mechanical, optical and other electrical properties.

The exemplary integrated capacitor in the exemplary embodiment of FIG. 3 has the same structure as the exemplary nanostructured capacitor described above. This exemplary integrated capacitor includes capacitor electrode 306 formed on a capacitor portion of outer insulating layer 106 of the nanostructured element. This capacitor portion of outer insulating layer is located between the gate electrode and the drain electrode. Drain electrode 308 is used as the other electrode of the exemplary integrated capacitor.

In other, alternative exemplary nanostructured integrated circuits the capacitor portion of outer insulating layer may be located: 1) between the drain electrode and the end of the nanostructured element; 2) between the gate electrode and the source electrode; or 3) between the source electrode and the end of the nanostructured element.

It is also contemplated that additional components such as resistors, diodes or additional capacitors or TFT's may be integrated onto a single nanostructured element to form other exemplary nanostructured integrated circuits within the scope of the present invention.

One skilled in the art will understand that the single circular nanowire used in the exemplary embodiment of FIG. 3 may be replaced with any of the nanostructure arrays described above with reference to FIGS. 1A-1F, 1H, and 1I. It is also contemplated that the array(s) of nanostructured elements may be arranged such that some electronic components are integrated onto a subset of the nanostructured elements, while other electronic components are integrated onto another subset of the nanostructured elements, or all of the nanostructured elements. These subsets may include different numbers and/or types of nanostructured elements. The subset may be totally disjoint or some of the nanostructured elements may be in two, or more, subsets.

Figure 4A:
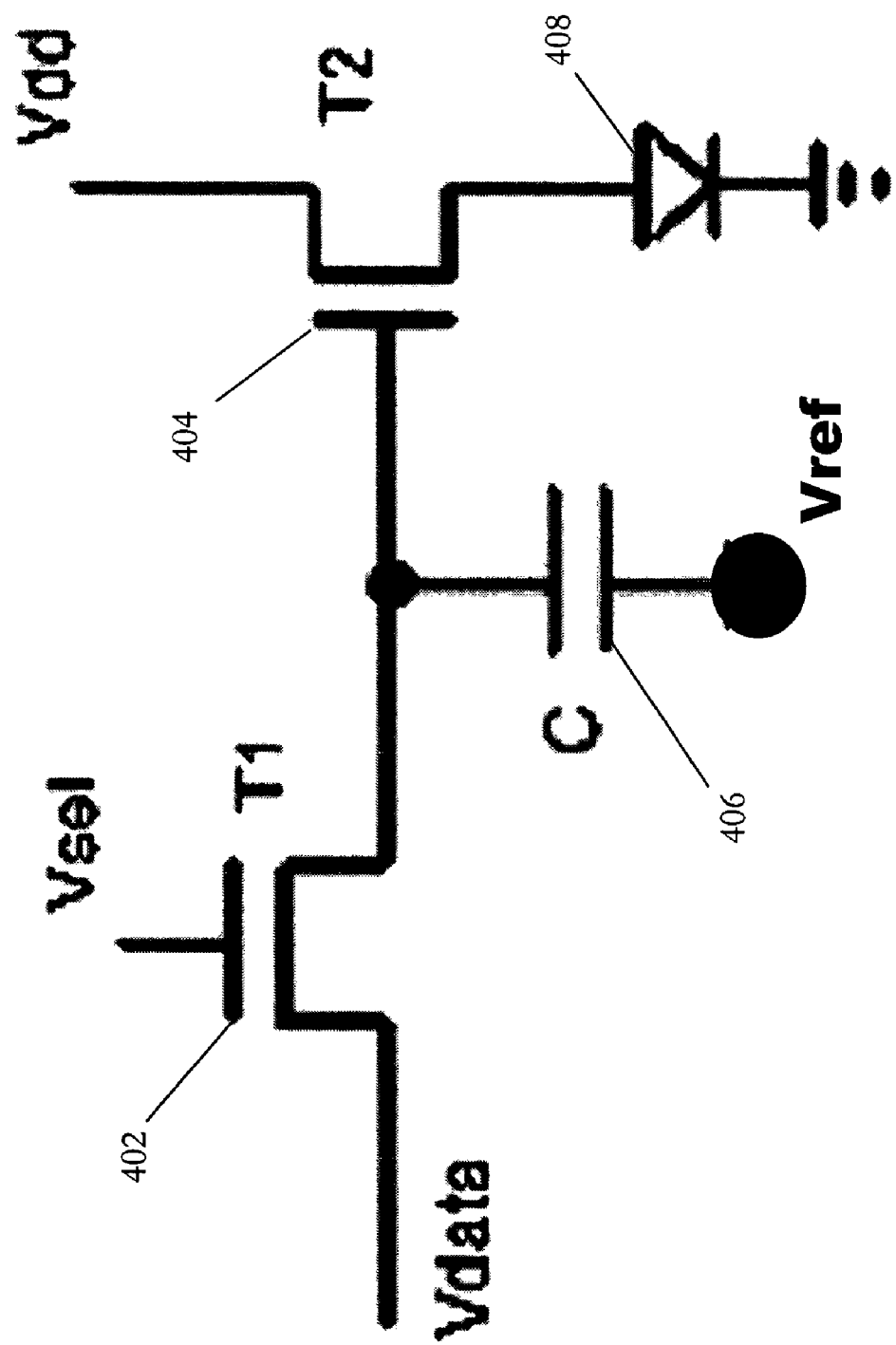
FIG. 4A is a schematic circuit diagram illustrating an exemplary active matrix pixel drive circuit according to the present invention.

In drive circuitry for active matrix displays, it may beneficial to include capacitors as well as TFT's in the pixel drive circuitries. This enables active matrix operation with a storage capacitor to provide a more stable picture in display. FIG. 4A is a schematic circuit diagram of integrated pixel circuit 400 that may be used to drive pixels in an active matrix display. This exemplary circuit includes two TFT's 402 and 404, storage capacitor 406, and lighting element 408. In the exemplary embodiment of FIG. 4A, one electrode of capacitor 406 is coupled between the drain of TFT 402 and the gate of TFT 404. However, exemplary embodiments of the present invention are not limited to this configuration. It is also noted that the other electrode of capacitor 406 is coupled to a reference voltage. This reference voltage may be the same reference voltage that lighting element 408 is coupled to (shown as ground in FIG. 4A), Vdd at the source of TFT 404, Vdd at the drain of TFT 404, or another preselected reference voltage.

In the case that the capacitor may be made from the same composition as the transistor channel, both components (transistor and capacitor) may be fabricated during the same process, which simplifies the manufacturing process of the display. For example, if a silicon nanowire is used for the transistor channel and surrounded with a silicon dioxide insulation layer that is used for gate insulator, as described with reference to FIG. 3 above; this core shell structure may be used to form a capacitor as well. The nanowire may be printed or aligned onto a desired location on the substrate and electrodes formed.

It is noted that integrated pixel circuit 400 is an example of a 2TFT1C pixel circuit; however, exemplary embodiments of the present invention are not limited to this particular circuit. In organic light emitting diode (OLED) applications, for example, pixel circuits that include two to six or more transistors and a few capacitors are common. It is contemplated that the present invention is applicable to such circuits. However, exemplary pixel circuit embodiments 400' and 400" (shown in FIGS. 4B and 4C, respectively) use 2TFT1C pixel circuits for ease of illustration.

Figure 4B:
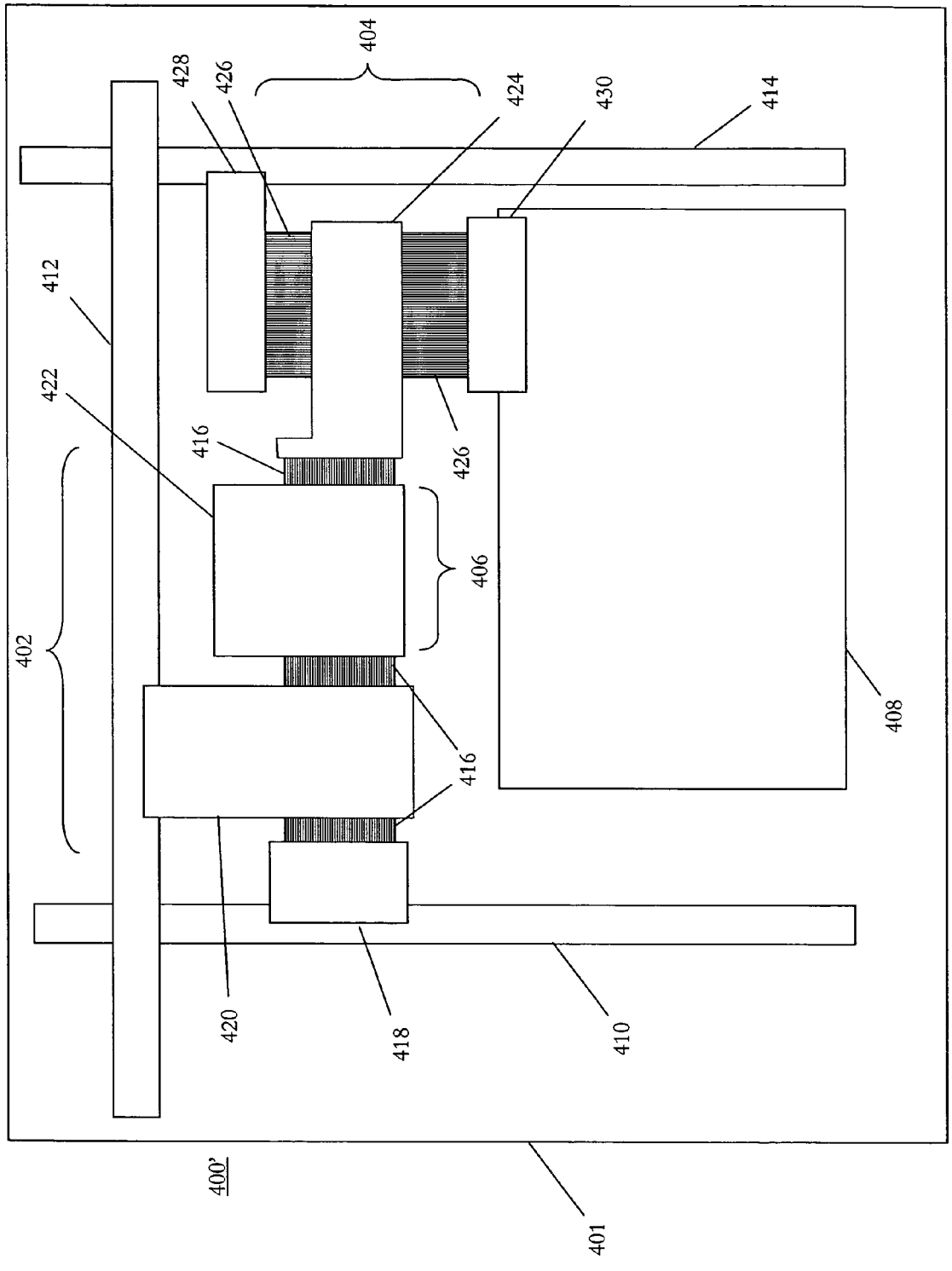
FIGS. 4B and 4C are top plan drawings illustrating exemplary integrated circuit embodiments of the active matrix pixel drive circuit of FIG. 4A utilizing nanostructured elements.
Figure 4C:
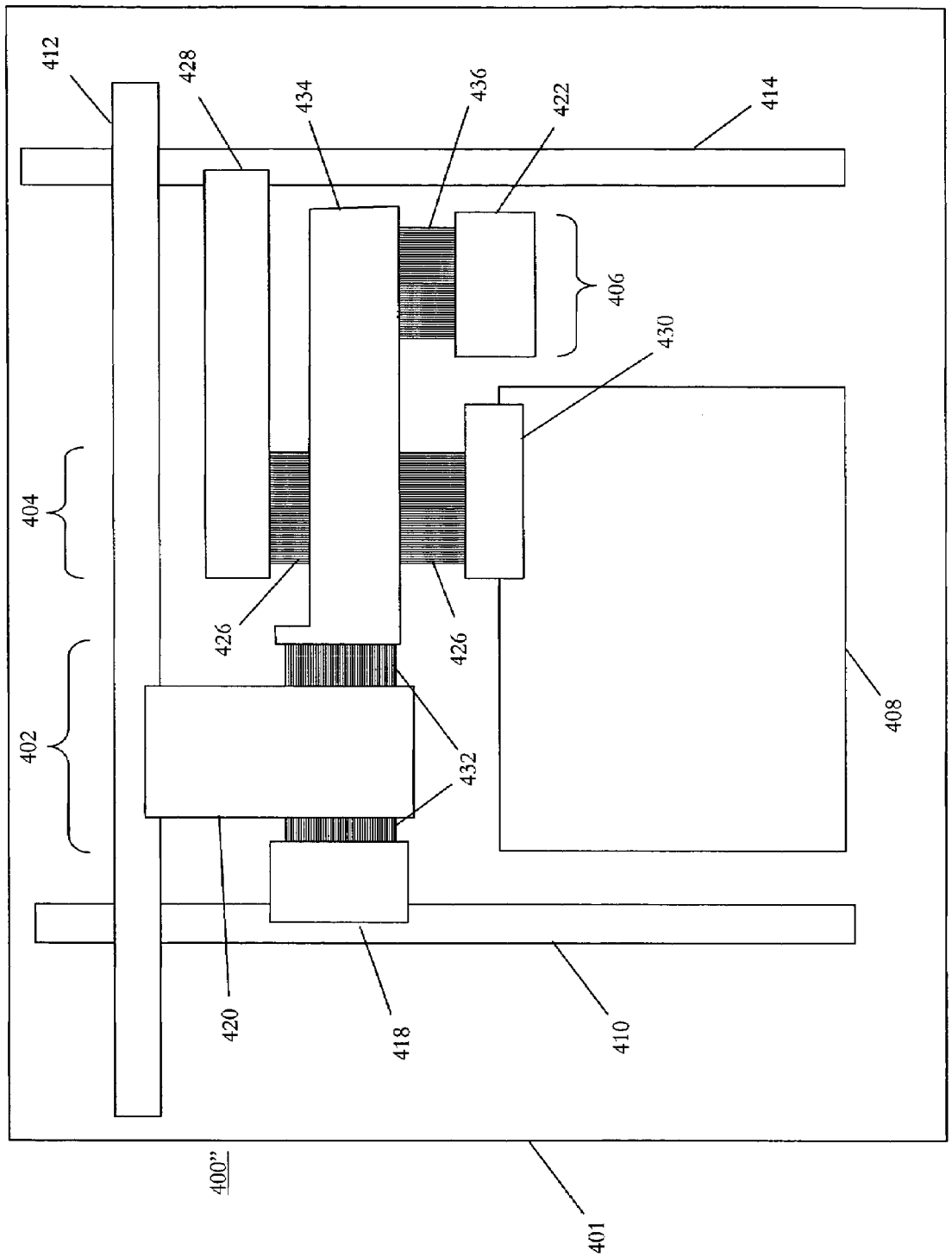
Figure 5:
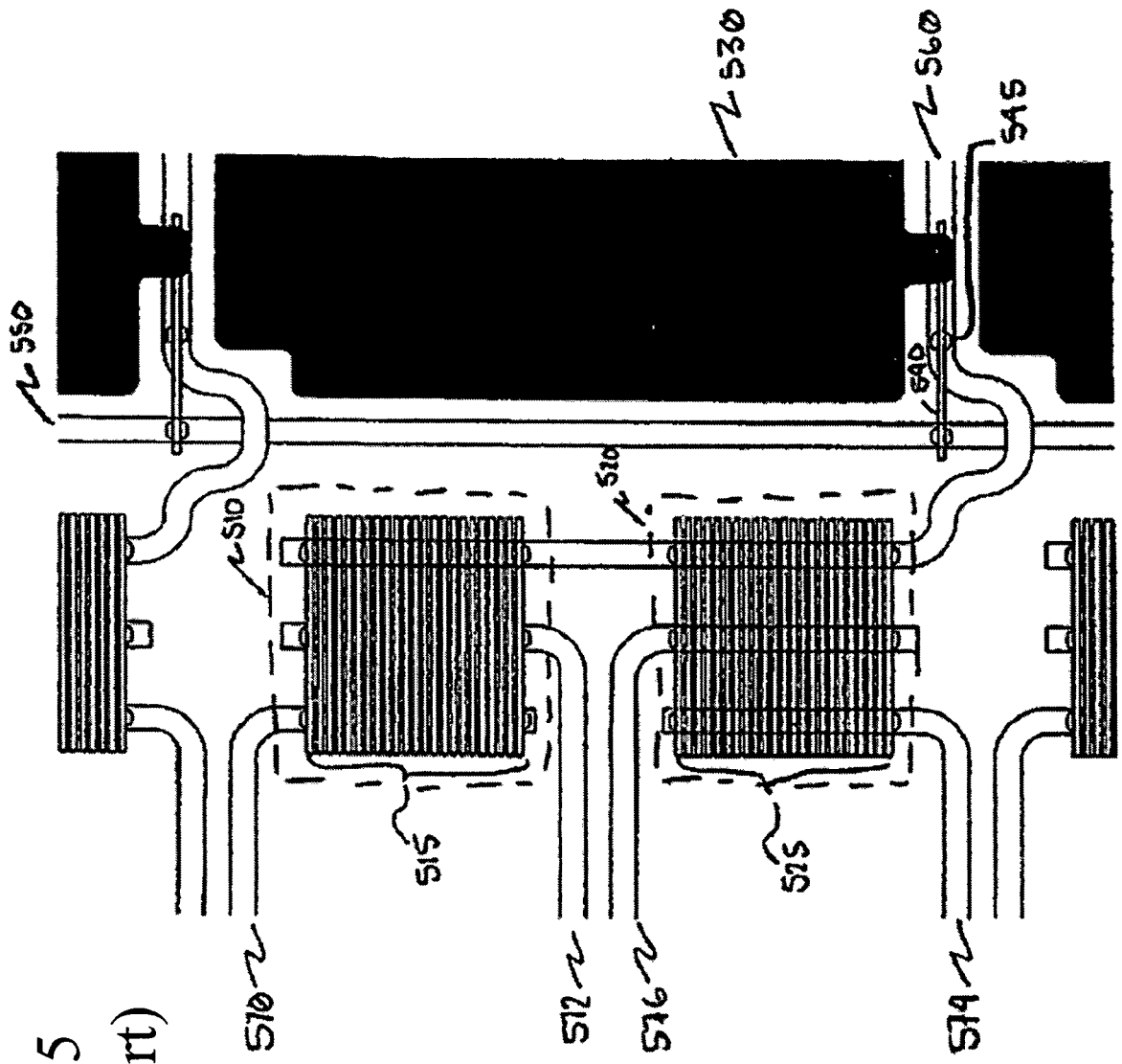
FIG. 5 (Prior art) is a top plan drawing of a prior art display driver circuit that includes nanowire enabled TFT's.

FIGS. 4B and 4C illustrate exemplary embodiments of exemplary circuit 400. In these exemplary embodiments, nanostructured materials 416 and 426 may desirably be aligned perpendicularly for each transistor (402 and 404, respectively). These exemplary configurations may help minimize the footprint of the circuit, however, they are not intended to be limiting. For example, it is contemplated that all subsets of the nanostructured materials may be aligned substantially parallel to each other. Such alignment of the nanostructured materials may simplify the manufacturing process of the resulting nanostructured integrated circuit.

In the exemplary embodiments of FIGS. 4B and 4C, nanostructured integrated pixel circuits 400' and 400" both include a substrate 401 with: data line 410 (which may supply a current signal or a voltage signal) formed on the top surface of the substrate; gate selection line 412 (which may supply a current signal or a voltage signal) formed on the top surface of the substrate; drive line 414 (which may supply drive current or drive voltage) formed on the top surface of the substrate; a plurality of nanostructured elements coupled to the top surface of the substrate; lighting element 408 coupled to the substrate; and various electrodes to couple the components.

In the exemplary embodiment of FIG. 4B (exemplary nanostructured integrated pixel circuits 400'), the nanostructured material is separated into two subsets on nanostructured elements 416 and 426. Subset 416, which is used to form transistor 402, shares its body with capacitor 406. Subset 426 is used to form TFT 404. Both subsets of nanostructured elements may include any of the various types of nanostructured elements described above with reference to FIGS. 1A-1I, as long as the core material is a semiconductive material. The subsets of nanostructured elements may include different types of nanostructured elements to form TFT's with different properties. Also, although the subsets of nanostructured elements are described as each including multiple nanostructured elements, it is contemplated that one or both of the subsets of nanostructured elements may contain only one nanostructured element.

Source electrode 418 of TFT 402 electrically couples the inner semiconductor material of each nanostructured element of the subset 416 to data line 410. Gate electrode 420 of TFT 402 is formed on a gate portion of the outer insulating layer of each nanostructured element of the subset 416 and is electrically coupled to gate selection line 412. Drain electrode 424 of TFT 402 is electrically coupled to the inner semiconductor material of each nanostructured element of the subset 416 and is formed on the gate portion of the outer insulating layer of each nanostructured element of the subset 426. Thus, drain electrode 424 of TFT 402 also serves as the gate electrode of TFT 404. Additionally, drain electrode 424 of TFT 402 serves as one of the electrodes of capacitor 406.

The other electrode of capacitor 406 is capacitor electrode 422 which is formed on a capacitor portion of the outer insulating layer of each nanostructured element of the subset 416 and is electrically coupled to a reference voltage such as, for example, ground.

Source electrode 428 of TFT 404 electrically couples the inner semiconductor material of each nanostructured element of the subset 426 to drive line 414. Drain electrode 430 of TFT 404 electrically couples the inner semiconductor material of each nanostructured element of the subset 426 to lighting element 408. Thus, drain electrode 430 of TFT 404 also serves as on electrode of lighting element 408. The other electrode of lighting element 408 (not shown) is desirably connected to a reference voltage, which may be ground.

In the exemplary embodiment of FIG. 4C (exemplary nanostructured integrated pixel circuits 400"), the nanostructured material is separated into three subsets on nanostructured elements 426, 432, and 436. Subset 432 is used to form transistor 402. Subset 426 is used to form TFT 404. Both of these subsets of nanostructured elements may include any of the various types of nanostructured elements described above with reference to FIGS. 1A-1I, as long as the core material is a semiconductive material. Subset 436 is used to form capacitor 406. This subset of nanostructured elements may include any of the various types of nanostructured elements described above with reference to FIGS. 1A-1I, including those with conductive core materials. The subsets of nanostructured elements may include different types of nanostructured elements to form electronic components with different properties. Also, although the subsets of nanostructured elements are described as each including multiple nanostructured elements, it is contemplated that one or both of the subsets of nanostructured elements may contain only one nanostructured element.

Source electrode 418 of TFT 402 electrically couples the inner semiconductor material of each nanostructured element of the subset 432 to data line 410. Gate electrode 420 of TFT 402 is formed on a gate portion of the outer insulating layer of each nanostructured element of the subset 432 and is electrically coupled to gate selection line 412. Drain electrode 434 of TFT 402 is electrically coupled to the inner semiconductor material of each nanostructured element of the subset 432 and is formed on the gate portion of the outer insulating layer of each nanostructured element of the subset 426. Thus, drain electrode 434 of TFT 402 also serves as the gate electrode of TFT 404. Additionally, drain electrode 424 of TFT 402 is electrically coupled to the inner semiconductor material of each nanostructured element of the subset 436 and, thus, serves as one of the electrodes of capacitor 406.

The other electrode of capacitor 406 is capacitor electrode 422 which is formed on a capacitor portion of the outer insulating layer of each nanostructured element of the subset 436 and is electrically coupled to a reference voltage such as, for example, ground.

Source electrode 428 of TFT 404 electrically couples the inner semiconductor material of each nanostructured element of the subset 426 to drive line 414. Drain electrode 430 of TFT 404 electrically couples the inner semiconductor material of each nanostructured element of the subset 426 to lighting element 408. Thus, drain electrode 430 of TFT 404 also serves as on electrode of lighting element 408. The other electrode of lighting element 408 (not shown) is desirably connected to the reference voltage.

Lighting element 408 may desirably be a light emitting element such as: a light emitting diode; an organic light emitting diode; an electroluminescent element; or an organic electroluminescent element. Alternatively, this element may be a light transmissive element, such as a liquid crystal. It is noted that lighting element 408 of FIGS. 4B and 4C may also include nanostructured materials such as nanowire. In such case, depending on pixel circuit configuration, the lighting element 408 may be directly connected to capacitor 406. Thus, capacitor 406 may be formed from the same nanostructured materials as TFT 402 and/or lighting element 408.

The present invention includes a number of exemplary embodiments of nanostructured integrated circuits including nanostructured capacitors and other nanostructured electronic components. Although the invention is illustrated and described herein with reference to specific embodiments, it is not intended to be limited to the details shown. Rather, various modifications may be made in the details within the scope and range of equivalents of the claims and without departing from the invention. In particular, one skilled in the art may understand that many features of the various specifically illustrated exemplary embodiments may be mixed to form additional exemplary precision machining systems and methods also embodied by the present invention.

What is claimed:

1. A nanostructured integrated circuit comprising:
   a substrate having a surface;
   a plurality of nanostructured elements coupled to the surface of the substrate, each nanostructured element including:
      an inner semiconductor material including a source portion and a drain portion; and
      an outer insulating layer formed on the inner semiconductor material;
   a thin film transistor (TFT) formed on the surface of the substrate, the TFT including:
      a first subset of the plurality of nanostructured elements arrayed together on the surface of the substrate;
      a source electrode electrically coupled to the source portion of the inner semiconductor material of each nanostructured element of the first subset of nanostructured elements;
      a drain electrode electrically coupled to the drain portion of the inner semiconductor material of each nanostructured element of the first subset of nanostructured elements; and
      a gate electrode formed on a gate portion of the outer insulating layer of each nanostructured element of the first subset of nanostructured elements; and
   a capacitor formed on the surface of the substrate, the capacitor including:
      a second subset of the plurality of nanostructured elements arrayed together on the surface of the substrate;
      a first capacitor electrode electrically coupled to one of the source electrode, the gate electrode, or the drain electrode; and
      a second capacitor electrode formed on a capacitor portion of the outer insulating layer of each nanostructured element of the second subset of nanostructured elements.

2. A nanostructured integrated circuit according to claim 1, wherein each nanostructured element is selected from the group consisting of: a substantially straight nanowire; a curved nanowire; a nanowire having at least one bend; a substantially straight nanoribbon; a curved nanoribbon; a nanoribbon having at least one bend; a substantially straight nanorod; a curved nanorod; or a nanorod having at least one bend.

3. A nanostructured integrated circuit according to claim 1, wherein the inner semiconductor material of each nanostructured element includes at least one of: carbon; silicon; germanium; grey tin; SiGe; SiC; AlAs; AlP; AlSb; BN; BP; GaAs; GaN; GaP; GaSb; InAs; InP; InSb; CdS; CdSe; CdTe; ZnO; ZnS; PbS; PbTe; a IV-IV semiconductor; a III-V semiconductor; a II-VI semiconductor; a IV-VI semiconductor; an organic semiconductor; a liquid semiconductor; an ionic liquid semiconductor; or a solid state ionic liquid semiconductor.

4. A nanostructured integrated circuit according to claim 1, wherein the inner semiconductor material of each nanostructured element is one of: an intrinsic semiconductor material; an n-type semiconductor material; or a p-type semiconductor material.

5. A nanostructured integrated circuit according to claim 1, wherein one or more sections of the inner semiconductor material of each nanostructured element are doped to form a longitudinal doping profile in the inner semiconductor material, the doping profile being one of NPN, PNP, PIP, NIN, or PIN.

6. A nanostructured integrated circuit according to claim 1, wherein the inner semiconductor material of each nanostructured element is one of: a single crystalline material; a polycrystalline material; or an amorphous material.

7. A nanostructured integrated circuit according to claim 1, wherein the outer insulating layer of each nanostructured element is one of: a single crystalline material; a polycrystalline material; an amorphous material; a solid state ionic liquid; or an organic compound.

8. A nanostructured integrated circuit according to claim 1, wherein
   the outer insulating layer of each nanostructured element is one of a liquid, an ionic liquid, a gas, or vacuum; and
   each nanostructured element further includes an encapsulation layer to contain the outer insulating layer.

9. A nanostructured integrated circuit according to claim 1, wherein the first subset of nanostructured elements is arrayed such that a longitudinal axis of each nanostructured element is one of: substantially parallel to the surface of the substrate; or substantially normal to the surface of the substrate.

10. A nanostructured integrated circuit according to claim 1, wherein the nanostructured elements of the first subset of nanostructured elements are arrayed substantially parallel to each other on the surface of the substrate.

11. A nanostructured integrated circuit according to claim 10, wherein the first subset of nanostructured elements is arrayed in a single layer.

12. A nanostructured integrated circuit according to claim 10, wherein the nanostructured elements of the second subset of nanostructured elements are arrayed substantially parallel to each other on the surface of the substrate.

13. A nanostructured integrated circuit according to claim 12, wherein the second subset of nanostructured elements is arrayed such that a longitudinal axis of each nanostructured element in the second subset of nanostructured elements is substantially perpendicular to a longitudinal axis of each nanostructured element in the first subset of nanostructured elements.

14. A nanostructured integrated circuit according to claim 1, wherein the inner semiconductor material of the first subset of nanostructured elements is highly doped in at least one of: the source portion or the drain portion.

15. A nanostructured integrated circuit according to claim 1, wherein:
the inner semiconductor material further includes a first end and a second end; and
at least one of:
the source portion of the inner semiconductor material is located proximate to the first end of the inner semiconductor material; or
the drain portion of the inner semiconductor material is located proximate to the second end of the inner semiconductor material.

16. A nanostructured integrated circuit according to claim 1, wherein the second subset of nanostructured elements is arrayed such that a longitudinal axis of each nanostructured element is one of: substantially parallel to the surface of the substrate; or substantially normal to the surface of the substrate.

17. A nanostructured integrated circuit according to claim 1, wherein:
every nanostructured element in the first subset of nanostructured elements is in the second subset of nanostructured elements; and
every nanostructured element in the second subset of nanostructured elements is in the first subset of nanostructured elements.

18. A nanostructured integrated circuit according to claim 17, wherein the capacitor portion of the outer insulating layer is located along a longitudinal axis of each nanostructured element:
between the gate portion of the outer insulating layer and the drain portion of the inner semiconductor material; or
between the gate portion of the outer insulating layer and the source portion of the inner semiconductor material.

19. A nanostructured integrated circuit according to claim 1, wherein:
no nanostructured element in the first subset of nanostructured elements is in the second subset of nanostructured elements; and
no nanostructured element in the second subset of nanostructured elements is in the first subset of nanostructured elements.

20. A nanostructured integrated circuit according to claim 1, wherein the second subset of nanostructured elements is arrayed in a single layer.

21. A nanostructured integrated circuit according to claim 1, wherein the inner semiconductor material of the second subset of nanostructured elements is highly doped in a portion adjacent to the capacitor portion of the outer insulating layer.

22. A nanostructured integrated circuit according to claim 1, further comprising:
another TFT formed on the surface of the substrate, the other TFT including:
a third subset of the plurality of nanostructured elements arrayed together on the surface of the substrate;
another source electrode electrically coupled to the source portion of the inner semiconductor material of each nanostructured element of the third subset of nanostructured elements;
another drain electrode electrically coupled to the drain portion of the inner semiconductor material of each nanostructured element of the third subset of nanostructured elements; and
another gate electrode formed on a gate portion of the outer insulating layer of each nanostructured element of the third subset of nanostructured elements; and
a lighting element formed on the substrate and including:
a first electrode electrically coupled to the other drain electrode of the other TFT; and
a second electrode electrically coupled to a first reference voltage,
wherein:
the source electrode of the TFT is electrically coupled to a data line;
the gate electrode of the TFT is electrically coupled to a gate selection line;
the other source electrode of the other TFT is electrically coupled to a drive line;
the other gate electrode of the other TFT is electrically coupled to the drain electrode of the TFT;
the first capacitor electrode is electrically coupled to the drain electrode of the TFT; and
the second capacitor electrode is electrically coupled to a second reference voltage.

23. A nanostructured integrated pixel circuit according to claim 22, wherein:
no nanostructured element in the first subset of nanostructured elements is in the second subset of nanostructured elements or the third subset of nanostructured elements;
no nanostructured element in the second subset of nanostructured elements is in the first subset of nanostructured elements or the third subset of nanostructured elements; and
no nanostructured element in the third subset of nanostructured elements is in the first subset of nanostructured elements or the second subset of nanostructured elements.

24. A nanostructured integrated pixel circuit according to claim 22, wherein:
every nanostructured element in the first subset of nanostructured elements is in the second subset of nanostructured elements;
no nanostructured element in the first subset of nanostructured elements is in the third subset of nanostructured elements;
every nanostructured element in the second subset of nanostructured elements is in the first subset of nanostructured elements;
no nanostructured element in the second subset of nanostructured elements is in the third subset of nanostructured elements;
no nanostructured element in the third subset of nanostructured elements is in the first subset of nanostructured elements or the second subset of nanostructured elements.

25. A nanostructured integrated pixel circuit according to claim 22, wherein the lighting element is one of: a liquid crystal element; a light emitting diode; an organic light emitting diode; an electroluminescent element; or an organic electroluminescent element.

26. A nanostructured capacitor comprising:
a substrate having a surface;
a plurality of nanostructured elements coupled to the surface of the substrate, each nanostructured element including a core material having a contact portion and an outer insulating layer formed on the core material;
a first capacitor electrode electrically coupled to the contact portion of the core material of each nanostructured element; and
a second capacitor electrode formed on a capacitor portion of the outer insulating layer of each nanostructured element.

27. A nanostructured capacitor according to claim 26, wherein each nanostructured element is one of: a substantially straight nanowire; a curved nanowire; a nanowire having at least one bend; a substantially straight nanoribbon; a curved nanoribbon; a nanoribbon having at least one bend; a substantially straight nanorod; a curved nanorod; or a nanorod having at least one bend.

28. A nanostructured capacitor according to claim 26, wherein the core material of each nanostructured element includes one of a conductive material or a semiconductive material.

29. A nanostructured capacitor according to claim 26, wherein the core material of each nanostructured element is one of: a single crystalline material; a polycrystalline material; an organic material; or an amorphous material.

30. A nanostructured capacitor according to claim 26, wherein the outer insulating layer of each nanostructured element is one of: a single crystalline material; a polycrystalline material; an amorphous material; or an organic compound.

31. A nanostructured capacitor according to claim 26, wherein
 the outer insulating layer of each nanostructured element is one of a liquid, an ionic liquid, a gas, or vacuum; and
 each nanostructured element further includes an encapsulation layer to contain the outer insulating layer.

32. A nanostructured capacitor according to claim 26, wherein the plurality of nanostructured elements is arrayed such that a longitudinal axis of each nanostructured element is one of: substantially parallel to the surface of the substrate; or substantially normal to the surface of the substrate.

33. A nanostructured capacitor according to claim 26, wherein the nanostructured elements of the plurality of nanostructured elements are arrayed substantially parallel to each other on the surface of the substrate.

34. A nanostructured capacitor according to claim 33, wherein the plurality of nanostructured elements are arrayed in a single layer.

35. A nanostructured capacitor according to claim 26, wherein the core material of the plurality of nanostructured elements is a semiconductive material that is highly doped in a portion adjacent to the capacitor portion of the outer insulating layer.

36. A nanostructured integrated circuit comprising:
 a nanostructured element including:
  an inner semiconductor material having a source portion and a drain portion; and
  an outer insulating layer formed on the inner semiconductor material;
 a thin film transistor (TFT) formed along the nanostructured element, the TFT including:
  the inner semiconductor material of the nanostructured element;
  a source electrode electrically coupled to the source portion of the inner semiconductor material of the nanostructured element;
  a drain electrode electrically coupled to the drain portion of the inner semiconductor material of the nanostructured element;
  a gate portion of the outer insulating layer located between the source electrode and the drain electrode; and
  a gate electrode formed on the gate portion of the outer insulating layer of the nanostructured element; and
 a capacitor formed along the nanostructured element, the capacitor including:
  a capacitor portion of the outer insulating layer of the nanostructured element, the capacitor portion of the outer insulating layer located between the gate portion of the outer insulating layer and one of:
   the drain electrode; or
   the source electrode; and
  a capacitor electrode formed on the capacitor portion of the outer insulating layer of the nanostructured element.

\* \* \* \* \*